US007753584B2

(12) United States Patent
Gambino et al.

(10) Patent No.: US 7,753,584 B2
(45) Date of Patent: Jul. 13, 2010

(54) THERMOCOUPLES

(75) Inventors: Richard J. Gambino, Stony Brook, NY (US); Jon Patrick Longtin, Port Jefferson, NY (US); Jeffrey A. Brogan, Stony Brook, NY (US); Jonathan S. Gutleber, Huntington, NY (US); Robert J. Greenlaw, Huntington Beach, CA (US)

(73) Assignee: Mesoscribe Technologies, Inc., Stony Brook, NY (US)

( * ) Notice: Subject to any disclaimer, the term of this patent is extended or adjusted under 35 U.S.C. 154(b) by 0 days.

(21) Appl. No.: 11/695,451

(22) Filed: Apr. 2, 2007

(65) Prior Publication Data

US 2007/0227576 A1  Oct. 4, 2007

Related U.S. Application Data

(60) Provisional application No. 60/788,220, filed on Mar. 31, 2006.

(51) Int. Cl.
G01K 7/02 (2006.01)
H01L 35/28 (2006.01)

(52) U.S. Cl. .................... 374/179; 136/225; 136/233

(58) Field of Classification Search ............... 374/179; 136/230, 236.1, 233, 225, 227, 242
See application file for complete search history.

(56) References Cited

U.S. PATENT DOCUMENTS

| 2,981,775 | A | * | 4/1961 | Bachman | .................... 136/227 |
| 3,556,865 | A | * | 1/1971 | Levy | ......................... 136/233 |
| 4,029,520 | A | | 6/1977 | Hampl, Jr. | |
| 4,104,605 | A | * | 8/1978 | Boudreaux et al. | ............. 338/2 |
| 4,423,967 | A | * | 1/1984 | Mouton | ...................... 374/138 |
| 4,440,508 | A | * | 4/1984 | Haloburdo et al. | .......... 374/144 |
| 4,904,091 | A | * | 2/1990 | Ward | .......................... 374/179 |
| 5,167,723 | A | * | 12/1992 | Tsukakoshi | ................. 136/225 |
| 5,251,981 | A | * | 10/1993 | Kreider | ....................... 374/179 |
| 5,370,459 | A | * | 12/1994 | Culbertson et al. | .......... 374/179 |
| 5,411,600 | A | * | 5/1995 | Rimai et al. | ................. 136/225 |
| 6,037,645 | A | * | 3/2000 | Kreider | ....................... 257/467 |
| 6,072,165 | A | * | 6/2000 | Feldman | ..................... 219/543 |
| 6,084,174 | A | * | 7/2000 | Hedengren et al. | .......... 136/201 |
| 6,271,460 | B1 | * | 8/2001 | Yamashita et al. | .......... 136/205 |
| 6,838,157 | B2 | | 1/2005 | Subramanian | |
| 2002/0075937 | A1 | * | 6/2002 | Yi et al. | ....................... 374/179 |
| 2002/0189661 | A1 | * | 12/2002 | Caillat et al. | .............. 136/236.1 |
| 2003/0016116 | A1 | * | 1/2003 | Blaha | ............................. 338/2 |
| 2004/0101022 | A1 | * | 5/2004 | Hardwicke et al. | .......... 374/141 |

(Continued)

FOREIGN PATENT DOCUMENTS

WO  WO 2005093864 A1 * 10/2005

OTHER PUBLICATIONS

International Search Report.

*Primary Examiner*—Gail Verbitsky
*Assistant Examiner*—Mirellys Jagan
(74) *Attorney, Agent, or Firm*—F. Chau & Associates, LLC

(57) ABSTRACT

A thermocouple disposed on a substrate comprises a first leg of thermoelectric material, a second leg of thermoelectric material, and a thermocouple junction electrically connecting the first leg and the second leg, wherein a height of the thermocouple junction is substantially a height of the first or second legs.

11 Claims, 5 Drawing Sheets

U.S. PATENT DOCUMENTS

2005/0259719 A1* 11/2005 Phillips ................. 374/179
2007/0056624 A1* 3/2007 Gregory et al. ........... 136/238
2008/0013598 A1* 1/2008 Perotti et al. ............ 374/179

* cited by examiner

THERMOCOUPLES

CROSS-REFERENCE TO RELATED APPLICATION

This application claims priority to U.S. Provisional Application Ser. No. 60/788,220, filed on Mar. 31, 2006, which is herein incorporated by reference in its entirety.

BACKGROUND OF THE INVENTION

1. Technical Field

The present invention relates to electronic devices, and more particularly to a thermocouple and methods of fabricating thermocouples.

2. Discussion of Related Art

Thermocouples measure temperature. Thermocouples include two dissimilar metals, joined together at one end, which produce a small unique voltage for a given temperature. This voltage is measured and interpreted by a thermocouple thermometer.

There are various problems that reduce component survival, service lifetime and accuracy for embedded thermocouples in harsh thermal environments in the presence of oxidizing or other reactive gases. These problems include failure of the thermal barrier coating including cracking and spalling, oxidation of the thermocouple, and temperature measurement errors caused by the use of non-standard thermocouple alloy compositions.

Referring to FIG. 1, thin film thermocouples are constructed by overlapping alloy layers 101 and 102 over another to form a junction 103 disposed on a substrate 104. This can be done with a set of masks, one for each leg or by direct write processes. In either case, the junction region has twice the thickness d of the film in the individual leg conductors 101 and 102. The added thickness has several possible detrimental effects. If the thermocouple is buried under a thermal barrier coating the thicker junction region can act as a mechanical tripping point particularly under thermal cycling or other thermo-mechanical stress. Higher stresses build up in thicker coatings so the junction tends to be the point at which delamination of the junction from the substrate initiates. Furthermore, the region where the top coating passes over the edge of the bottom layer is a high stress region prone to cracking or other failure modes. In the manufacture of thermal flux sensors, several thermocouples are embedded in a thermal insulator at different depths. With the overlapping junction design the junctions must be offset from each other in the horizontal plane because the thickness build up is too great if two or more junctions are located one above the other. The heat flux can be more accurately measured with the low profile thermocouples of this invention because they can be located at the same point so they are not affected by lateral temperature gradients.

Therefore, a need exists for a system and method of fabricating thermocouples having durable construction and accurate operation.

SUMMARY OF THE INVENTION

According to an embodiment of the present disclosure, a thermocouple disposed on a substrate comprises a first leg of thermoelectric material, a second leg of thermoelectric material, and a thermocouple junction electrically connecting the first leg and the second leg, wherein a height of the thermocouple junction is substantially a height of the first or second legs.

According to an embodiment of the present disclosure, a thermocouple having a thermocouple junction is formed by continuously varying a composition of a line over a portion of the line, forming a graded junction with substantially a height of a conducting line electrically coupled at the thermocouple junction.

According to an embodiment of the present disclosure, a thermocouple comprises at least first and second thermocouple legs each having an alloy composition, and a plurality of isothermal contact pads for electrically coupling the at least first and second thermocouple legs to collect a signal.

BRIEF DESCRIPTION OF THE DRAWINGS

Preferred embodiments of the present invention will be described below in more detail, with reference to the accompanying drawings.

DETAILED DESCRIPTION OF EXEMPLARY EMBODIMENTS

According to an embodiment of the present disclosure, a thermocouple device has desirable durability and accuracy. The thermocouple device may be implemented as a low profile thermocouple, a graded junction low profile thermocouple, a three terminal thermocouple, or direct write thermal spray type thermocouple, among others.

The thermocouples can be embedded in a thermal barrier coating (TBC) used to protect a substrate from the high temperature combustion gases. These embedded thermocouples need to have a long service life and may be used to monitor the condition of the substrate, e.g., components of machinery operating in harsh environments.

The TBC comprises several layers that work in concert to protect the substrate metal, such as a superalloy. An upper layer of the TBC may be yttria stabilized zirconia (YSZ) deposited on a bond coat of an alloy containing aluminum, for example NiCrAlY. The YSZ forms an interface layer of $Al_2O_3$ by thermal oxidation of the bond coat during initial operation of the component, for example, a turbine blade or vane. The aluminum oxide formed at the interface slows further oxidation and promotes bonding of the YSZ to the bond coat. The thermocouple has substantially no impact on the thermal and structural integrity of the TBC coating system.

According to an embodiment of the present disclosure, a low profile thermocouple junction improves the mechanical stability of the TBC and is minimally impacted by the thermocouple. This can be accomplished with a direct write deposition system by making a side-by-side junction taking advantage of the Gaussian line profile of the deposited line. If the line centers are properly positioned with respect to each other, a reliable junction is formed where the height of the highest point in the junction is substantially the same as the height of an individual line.

By using a direct write system where the composition of the alloy can be changed during deposition, it is possible to make a graded junction where the composition changes from composition A to composition B over a finite distance. In direct write thermal spray, this can be accomplished with, for example, a deposition system with two powder feeders and two powder injection nozzles. As the deposition device traverses the part, the flow of powder A is turned off while the flow of powder B is turned on. Thus, a graded junction is formed where the alloy composition changes form A to B over a finite distance. The graded junction can be used when the thermocouple is deposited in a trench so that the height of the junction is substantially the same as the depth of the trench.

Figure 1:
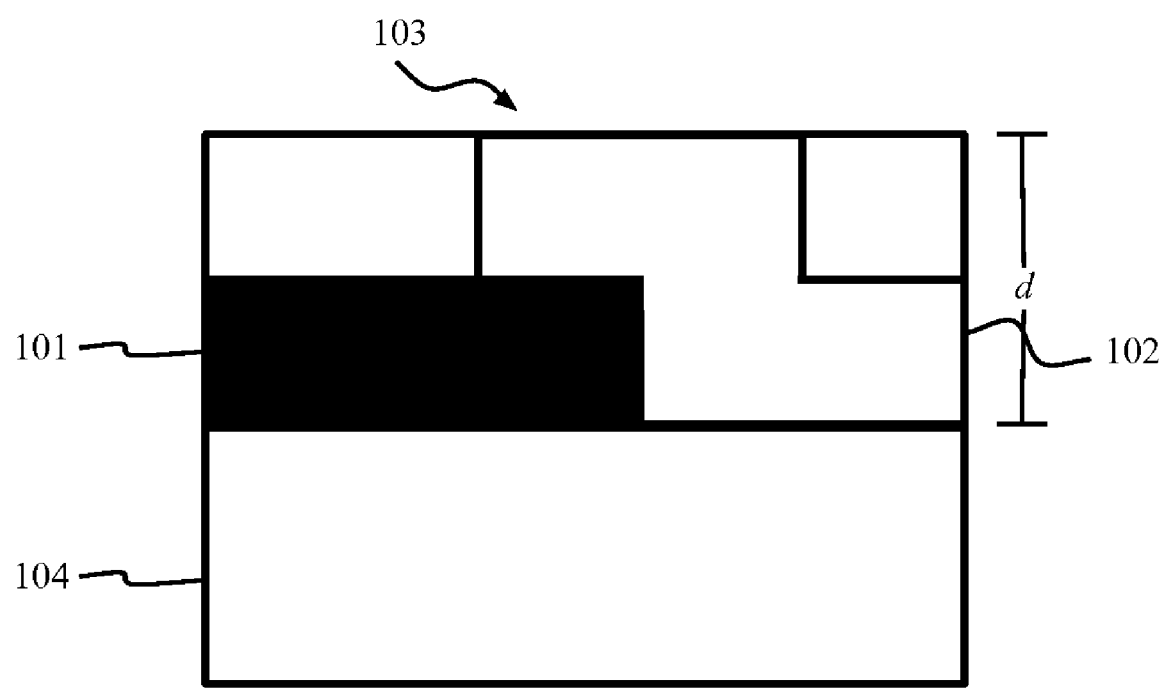
FIG. 1 is a diagram of a thermocouple.
Figure 2:
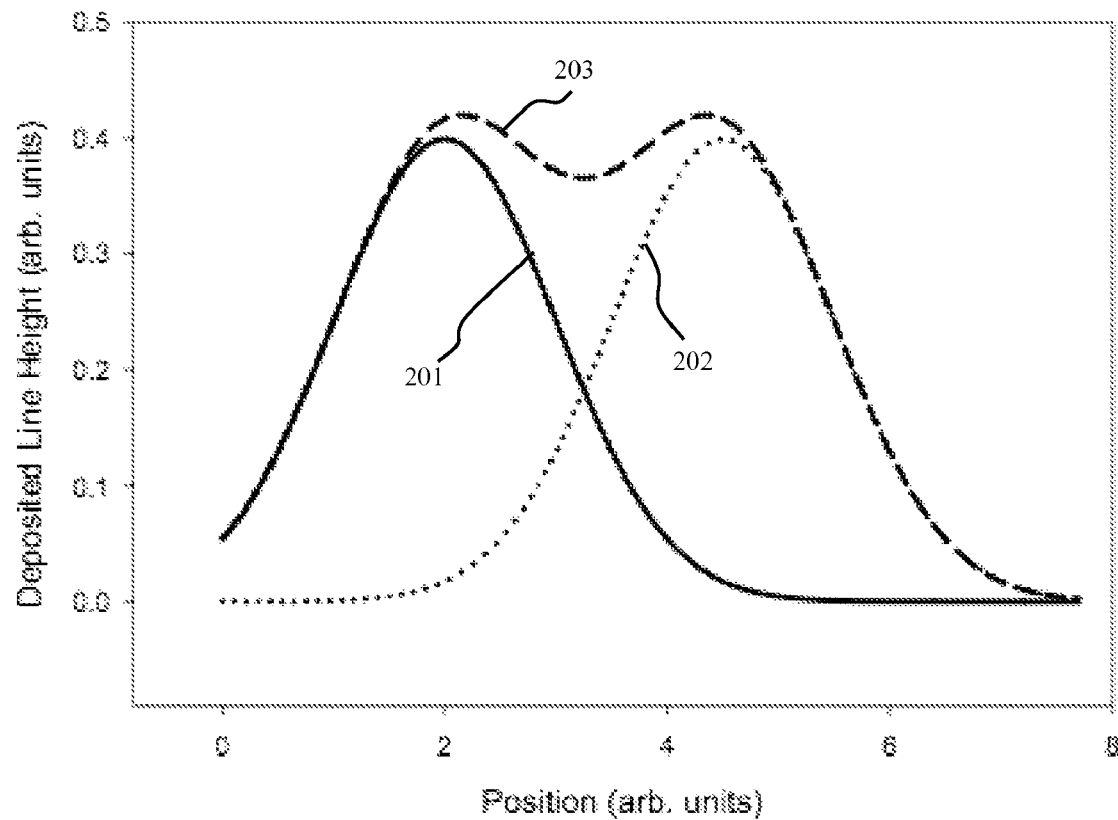
FIG. 2 is a Gaussian graph of line shapes with side-by-side overlap according to an embodiment of the present disclosure.
Figure 3:
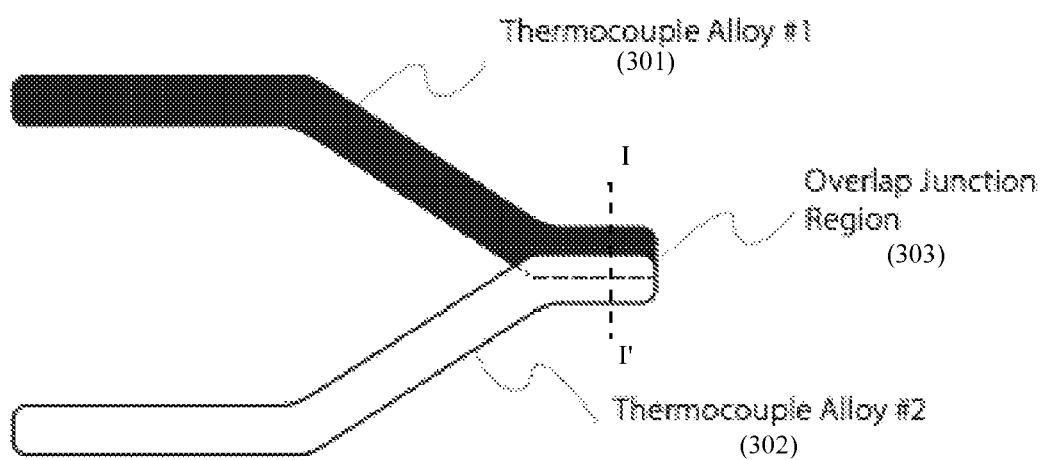
FIG. 3 is a diagram of a low profile thermocouple according to an embodiment of the present disclosure.
Figure 4A:
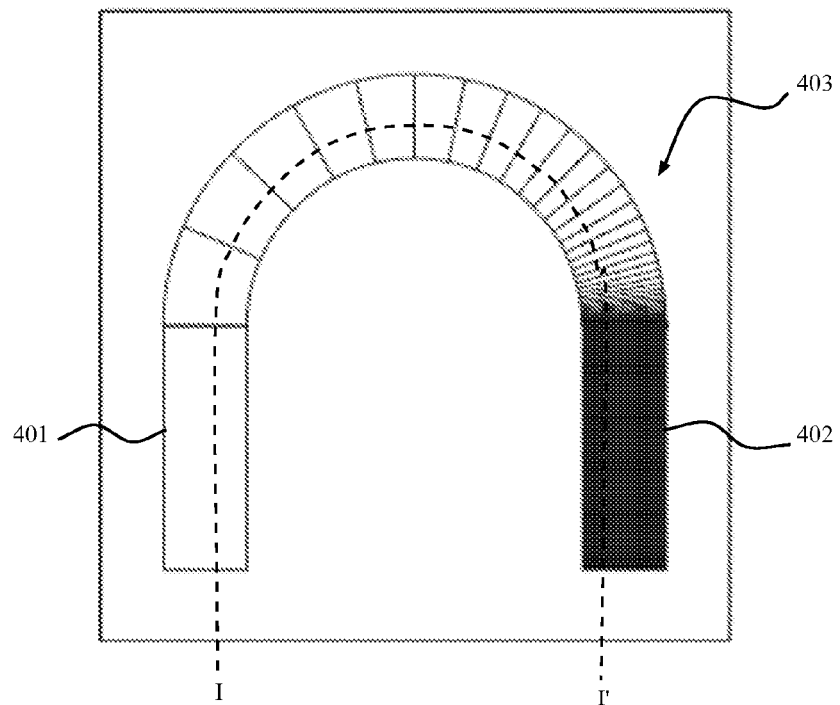
FIG. 4A is a diagram of a gradient junction low profile thermocouple according to an embodiment of the present disclosure.
Figure 4B:
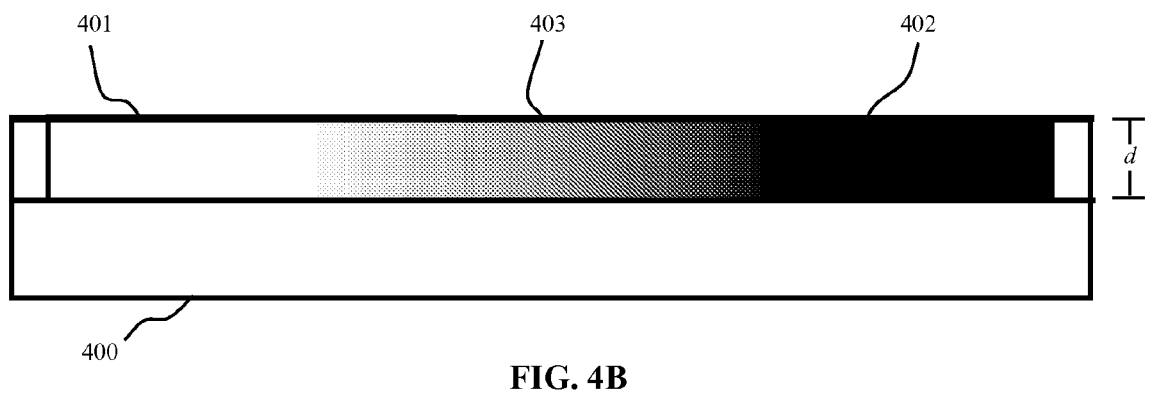
FIG. 4B is a diagram of the gradient junction low profile thermocouple of FIG. 3A along line II-II'.

According to an embodiment of the present disclosure, low profile thermocouples include a junction region having a thickness approximately equal to the thickness of a single layer (see FIGS. 3 and 4A-B). These thermocouples can be used under or in thermal barrier coatings and will not substantially comprise the mechanical integrity of the coating. The low profile thermocouple may use a Gaussian profile lines to create a side-by-side junction (see for example, FIGS. 2-3). A first leg of thermoelectric material 301 of the thermocouple is deposited with a Gaussian line profile 201. The junction 303 is formed by deposited a short line segment of a second leg of thermoelectric material 302, also with a Gaussian line profile 202, parallel to the first leg 301 with a separation of the center lines equal to a full width at half maximum (FWHM) of the line. The height profile through the junction region can be modeled by mathematically adding Gaussian functions. An example of two Gaussians added together with the separation equal to the FWHM is shown in FIG. 2 as 203. Note that the maximum deposited line height is only a few percent greater than the height of the individual legs 301 and 302. In a conventional overlap junction the maximum height in the junction is twice the maximum height of the individual lines (see for example, FIG. 1). An example of a side-by-side thermocouple junction is shown in FIG. 3.

Another approach to the formation of a low profile thermocouple is to use a NiCrAlY bond coat as one leg of the thermocouple. There are a number of alloy compositions used as bond coats for thermal barrier coatings including Co32Ni21Cr8Al0.5Y (Praxair CO-211), Ni22Cr10Al1Y, and Ni31Cr11Al0.1Y. The thermocouple is formed using a NiCrAlY composition such as Ni31Cr11Al0.1Y as one leg with Ni20Cr as the other leg. The NiCrAlY layer under the TBC is used to form the junction. A window is opened in the TBC down the NiCrAlY bond coat and the junction is formed between the Ni20Cr line and the NiCrAlY layer. The NiCrAlY layer is exposed in another location in a cold zone so that thermocouple lead wires can be welded to it. The lead or connecting wire should match the NiCrAlY composition closely so as to substantially prevent the generation of thermal EMF at the lead wire junction. Yet another approach is to vary the alloy composition, for example by using NiCrY and NiAlY materials, which are well suited for high-temperature operation and coating compatibility.

Referring to graded junction low profile thermocouples, a low profile direct write thermocouple includes a junction region having a thickness approximately equal to the thickness of the single layer. In the graded junction low profile thermocouple the composition of the direct written line is continuously varied in the junction region. To form a junction in a type K thermocouple (type K and type N as used herein are defined by the Instrument Society of America) with on leg of NiCr and the other lag of NiAl the composition in the junction region is continuously varied from NiCr to NiAl. In the direct write thermal spray (DWTS) process the composition is varied by using two powder feeders and separate powder injection tubes for each alloy. The powder feed rate of the NiCr is decreased and the feed rate of the NiAl is increased at the same time as a direct write head traverses through the junction region.

The length of the graded junction region should be as small, e.g., not more than about 10 mm, because a temperature gradient across the junction will introduce a small thermocouple EMF that will cause an error in the measurement of temperature difference between hot and cold junction. If the graded junction is isothermal, there will be no EMF, and this error will be zero.

The thermocouple can also be fabricated into a groove to maintain a level profile at the surface of the component, where the depth of the groove is substantially the thickness of the as-deposited positive and negative thermocouple alloy materials 401 and 402 (see FIGS. 4A-B), e.g., within about 25% of the maximum height of the legs 401 and 402. The positive and negative thermocouple alloy materials 401 and 402 are deposited having a gradient 403 therebetween. The groove depth d in a substrate material 400 is substantially equal to the line thickness. Additional layers may be formed on the substrate material 400 and positive and negative thermocouple alloy materials 401 and 402.

Figure 5:
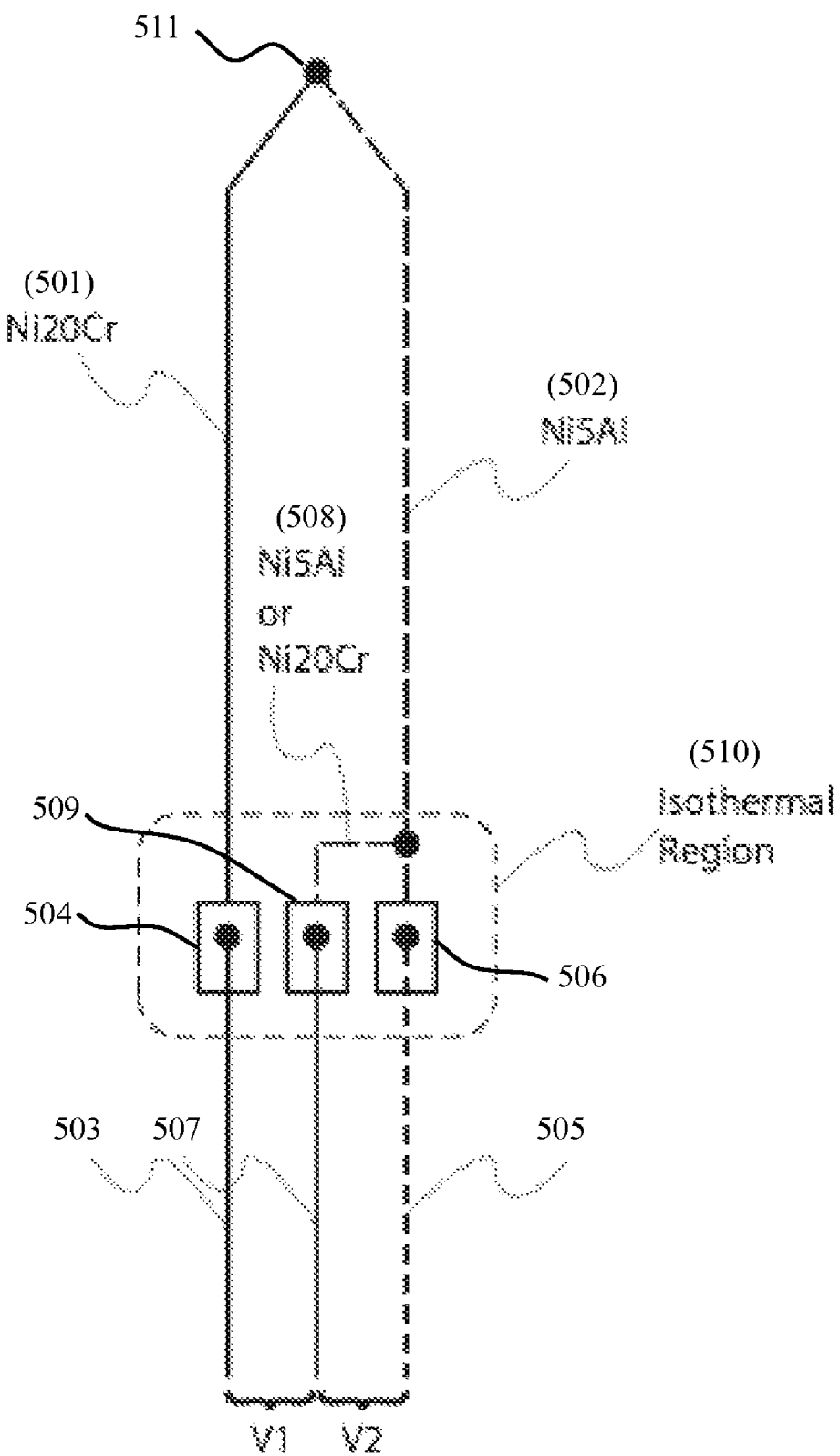
FIG. 5 is a diagram of a three terminal thermocouple according to an embodiment of the present disclosure.

Referring now to a three-terminal thermocouple as shown in FIG. 5, a direct write thermocouple uses alloy compositions to form thermocouple lines that cannot be drawn into wires. The alloy can be feed into the plasma torch in the form of powder and sprayed onto the surface of the turbine blade. The alloy composition can be adjusted for desirable oxidation resistance, compatibility with the thermal barrier coating or for its thermoelectric properties without the need for sufficient ductility to draw the material into wire.

The direct write thermocouple is connected to a measurement system with connecting wires and it is desirable to use connecting wires such as type K (Chromel and Alumel) for this purpose, for example. By using these connecting wires the temperature compensation for the room temperature contacts to the measuring instrument or data acquisition system can be done with a wide variety of commercially available products. The wire connection to the direct write thermocouple is typically done by welding the commercial type K connecting wires to contact pads at the root of the substrate, e.g., turbine blade. In order to compensate for the thermal EMF generated by the connecting wires, an independent measurement of the temperature is needed at the contact pads located at the root of the blade.

The temperature of the tip of the substrate, e.g., turbine blade, can be determined using the three terminal thermocouple system shown in the FIG. 5. In this example, a first leg 501 of the thermocouple is Ni20Cr (Nichrome) and a second leg 502 is Ni5Al. The connecting wires may be commercial type K thermocouple alloys Chromel and Alumel. In this example a first Chromel connecting wire 503 is connected to a contact pad 504 of the first leg 501 and an Alumel connecting wire 505 is connected to a contact pad 506 of the second leg 502. A second Chromel connecting wire 507 is connected to the contact pad 506 or a second pad 509 of the second leg 502. This can be done by welding the second Chromel connecting wire 507 directly to the Ni5Al contact pad 506 or by direct writing a Ni20Cr line 508 to the Ni5Al leg 502 using the second pad 509 of the second leg 502 in close proximity to the contact pad 506 the second leg 502 as shown in FIG. 5.

Referring to the Ni20Cr line 508, so long as the line 508 is the isothermal region 510, any conductor can be used for that line segment, it need not be restricted to NiAl or NiCr. This is also true of the contact pads, so for example, all the contact pads may be made of NiCr because it is easier to weld the connecting wires to it. All the contact pads are arranged close together on the root of a blade 511 so that they are in an isothermal region 510 (indicated by the dashed box in the figure). The end of the Chromel and Alumel connecting wires are connected to suitable compensated terminals at the measuring instrument.

For example, the temperature of a turbine blade tip 511 is determined by measuring the voltages V1 and V2. The voltages are related to the temperatures by the following equations:

$$V1 = S_{Kx}(T_{tip} - T_{root}) + S_K(T_{root} - T_{ref}) \quad \text{Eqn 1}$$

$$V2 = S_K(T_{root} - T_{ref}) \quad \text{Eqn 2}$$

Where $S_{Kx}$ is the Seebeck coefficient of the DW thermocouple and $S_K$ is the Seebeck coefficient of the type K thermocouple.

If the reference contacts are compensated, the equation become:

$$V1 = S_{Kx}(T_{tip} - T_{root}) + S_K(T_{root}) \quad \text{Eqn 3}$$

$$V2 = S_K(T_{root}) \quad \text{Eqn 4}$$

Subtracting Eqn 4 from Eqn 3 gives:

$$V1 - V2 = S_{Kx}(T_{tip} - T_{root}) \quad \text{Eqn 5}$$

$$(T_{tip} - T_{root}) = (V1 - V2)/S_{Kx}$$

Solving Eqn 4 for $T_{root}$ gives:

$$T_{root} = V2/S_K \quad \text{Eqn 6}$$

Substituting Eqn 6 into Eqn 5 gives:

$$(T_{tip} - V2/S_K) = (V1 - V2)/S_{Kx}$$

$$T_{tip} = (V1 - V2)/S_{Kx} + V2/S_K \quad \text{Eqn 7}$$

Equation 7 is used to determine the tip temperature. The assumptions in this analysis are that the Seebeck coefficients are constant over the temperature range of interest. If this is not the case, the integral form of the equations must be used.

Referring to a direct write thermal spray type N thermocouple, utilizing thermal spray and direct write thermal spray (DWTS) technologies, type N thermocouples have been fabricated and tested for operation as well as characterized for Seebeck coefficient. The benefit of type N thermocouples over traditional type K thermocouples have been documents in detail elsewhere. In brief, the type N thermocouple has very good thermocouple stability, superior to other base metal thermocouples and has excellent resistance to high temperature oxidation. They also do not suffer from order-disorder transitions, which can result in different effective Seebeck coefficients within the thermocouple leading to errors and calibration drift. The Nicrosil-Nisil thermocouple is suited for accurate measurements in air up to about 1200° C. In vacuum or controlled atmosphere, it can withstand temperatures in excess of about 1200° C. Its sensitivity of 39 microvolts/° C. at 900° C. is slightly lower than type K (41 microvolts/° C.). DWTS type N sensors are under development for high temperature oxidizing service environments, where type K sensors have shown limited lifetimes. The deposited type N thermocouples were comprised of the following alloys given in Table 1. The composition of the conventional alloys used in conventional wire fabricated thermocouples is selected for suitable concentration can be used because there is less concern with the enbrittlement caused by Si in a thin film thermocouple than in a wire thermocouple. The higher Si concentration imparts improved high temperature oxidation resistance. Additional alloys of varying compositions similar to conventional compositions are under investigation.

TABLE 1

| Thermoelement | Conventional Alloy Composition | MST Utilized Composition |
| --- | --- | --- |
| Positive (NP) | Ni14Cr1.4Si | Ni19Cr10Si |
| Negative (NN) | Ni4.4Si0.15Mg | Ni4.5Si3B |

Figure 6:
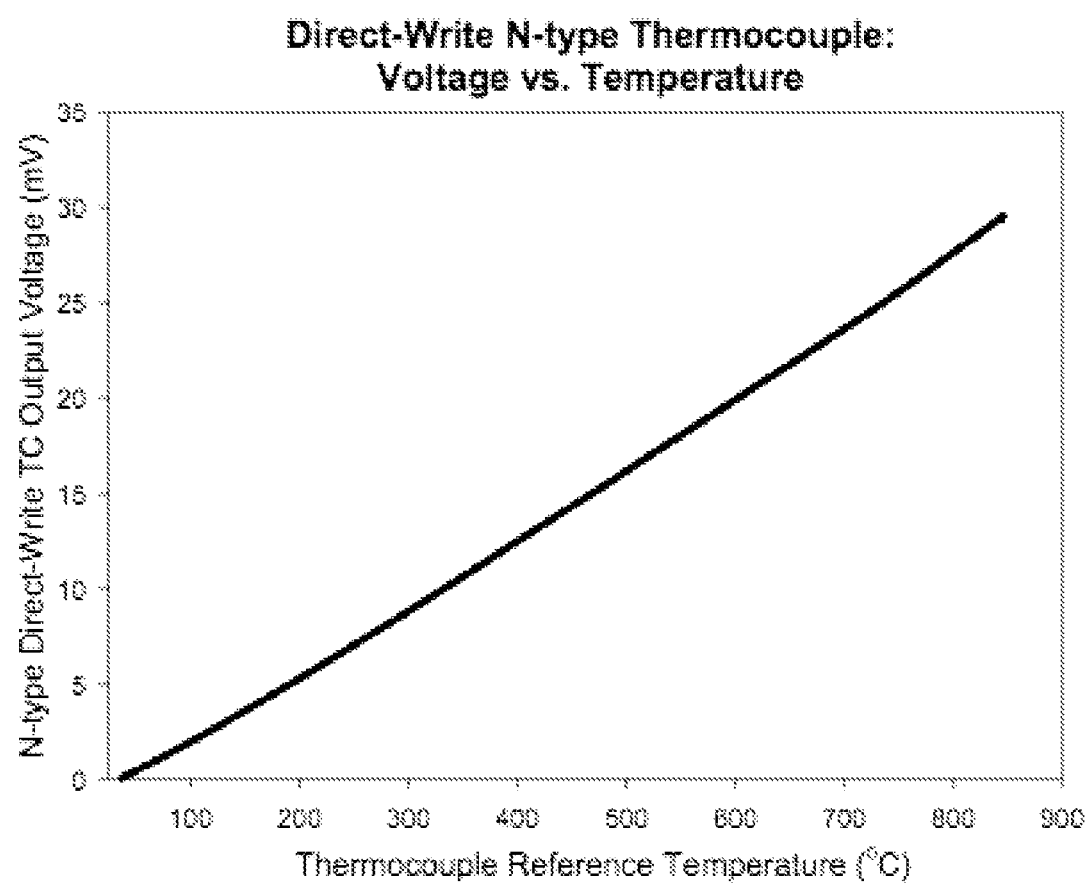
FIG. 6 is a graph of a voltage-temperature plot according to an embodiment of the present disclosure.

The type N Seebeck coefficients have been reported as 39 µV/° C. at 600° C. and 26.2 µV/° C. The data in FIG. 6 shows that the Seebeck coefficient of the DWTS thermocouple is in that range.

Having described embodiments for fabricating thermocouples, it is noted that modifications and variations can be made by persons skilled in the art in light of the above teachings. It is therefore to be understood that changes may be made in the particular embodiments of the invention disclosed which are within the scope and spirit of the disclosure.

What is claimed is:

1. A thermocouple disposed on a substrate comprising:
   a first leg of thermoelectric material;
   a second leg of thermoelectric material, wherein at least one of the first and second legs is formed of a metallic bond coat; and
   a thermocouple junction, wherein the first leg overlaps the second leg, electrically connecting the first leg and the second leg, wherein a height of the thermocouple junction is within 25% of a height of the first or second legs.

2. The thermocouple of claim 1, wherein the thermocouple is embedded in an insulating layer.

3. The thermocouple of claim 1, wherein the thermocouple is embedded in a thermal barrier coating.

4. The thermocouple of claim 1, wherein the thermocouple junction is comprised of segments of two substantially parallel lines with Gaussian line profiles that are separated by a distance equal to a full width at half maximum of the line segments.

5. The thermocouple of claim 1, wherein the thermocouple junction is a side-by-side thermocouple junction wherein a separation of center lines of the respective legs is about a full width at half maximum (FWHM) of the respective legs.

6. The thermocouple of claim 1, wherein the thermocouple junction is comprised of segments the first and second legs arranged to be substantially parallel and overlapping for electrical contact.

7. The thermocouple of claim 6, wherein centerlines of the segments of the first and second legs are separated by a distance equal to a full width at half maximum of the segments.

8. A thermocouple wherein a thermocouple junction is formed by continuously varying a composition of a line over a portion of the line, forming a graded junction with substantially a height of a conducting line electrically coupled at the thermocouple junction, wherein the thermocouple is deposited into a groove such that a top surface of the thermocouple junction and the conducting line are substantially level with a surface of a substrate.

9. The thermocouple of claim 8, wherein the thermocouple junction is formed from a first leg of thermoelectric material and a second leg of thermoelectric material, and the groove has a depth within about 25% of a height of the first leg or second leg.

10. A thermocouple disposed on a substrate comprising:
a first leg of thermoelectric material;
a second leg of thermoelectric material, wherein at least one of the first and second legs is formed of a metallic bond coat; and
a graded thermocouple junction formed of a continuously varying composition of the first leg and the second leg, electrically connecting the first leg and the second leg, wherein a height of the thermocouple junction is substantially a height of at least one of the first and second legs, wherein the thermocouple is embedded in an insulating layer.

11. A thermocouple disposed on a substrate comprising:
a first leg of thermoelectric material;
a second leg of thermoelectric material, wherein at least one of the first and second legs is formed of a metallic bond coat; and
a graded thermocouple junction formed of a continuously varying composition of the first leg and the second leg, electrically connecting the first leg and the second leg, wherein a height of the thermocouple junction is substantially a height of at least one of the first and second legs, wherein the thermocouple is embedded in a thermal barrier coating.

* * * * *